United States Patent [19]

Phillips et al.

[11] Patent Number: 5,065,338

[45] Date of Patent: Nov. 12, 1991

[54] EXPERT INFORMATION SYSTEM AND METHOD FOR DECISION RECORD GENERATION

[75] Inventors: Clarence W. Phillips; William F. Phillips; Gerry A. Jacobus, all of Canton, Ill.

[73] Assignee: Active English Information Systems, Inc., Canton, Ill.

[21] Appl. No.: 359,031

[22] Filed: May 26, 1989

Related U.S. Application Data

[63] Continuation-in-part of Ser. No. 867,105, May 23, 1986, Pat. No. 4,835,683.

[51] Int. Cl.$^5$ ............................................. G06F 15/18
[52] U.S. Cl. ............................................ 395/51; 395/54; 395/11
[58] Field of Search ................ 364/513, 200 MS File, 364/900 MS File

[56] References Cited

U.S. PATENT DOCUMENTS

| | | | |
|---|---|---|---|
| 4,370,707 | 1/1983 | Phillips et al. | 364/200 |
| 4,429,385 | 1/1984 | Chichelli et al. | 364/900 X |
| 4,555,775 | 11/1985 | Pike | 364/900 |
| 4,591,983 | 5/1986 | Bennett et al. | 364/403 |
| 4,635,136 | 1/1987 | Ciampa et al. | 364/900 X |
| 4,679,137 | 7/1987 | Lane et al. | 364/200 X |
| 4,783,752 | 11/1988 | Kaplan et al. | 364/513 |
| 4,866,635 | 9/1989 | Kahn et al. | 364/513 |
| 4,884,218 | 11/1989 | Agnew et al. | 364/513 |
| 4,920,499 | 4/1990 | Skeirik | 364/513 |

Primary Examiner—Thomas M. Heckler
Attorney, Agent, or Firm—Welsh & Katz, Ltd.

[57] ABSTRACT

An expert information system with which a decision maker in the construction, or a related industry, can generate a decision record and related control instructions in a facile manner without significant omissions while ensuring that substantially all of the options available for making the decisions have been considered. The expert system includes a microcomputer which executes a system control program to select information units from the expertise of a data base and to concentrate individual information units until an entire decision record has been generated. The process is enhanced by a multiwindowed display which displays possible selections from the expert data base while contrasting that data with data in another window having a list of data indicating the decisions or selections already made. A display pointer with a controllable position is employed to select lines and phrases of the expert information from that portion of the data base displayed in the selection window. The selection of such information causes the line or phrase from the data base, an information unit, to be transferred to the decision record and to the display of the selected decisions window.

10 Claims, 12 Drawing Sheets

Microfiche Appendix Included
(1 Microfiche, 64 Pages)

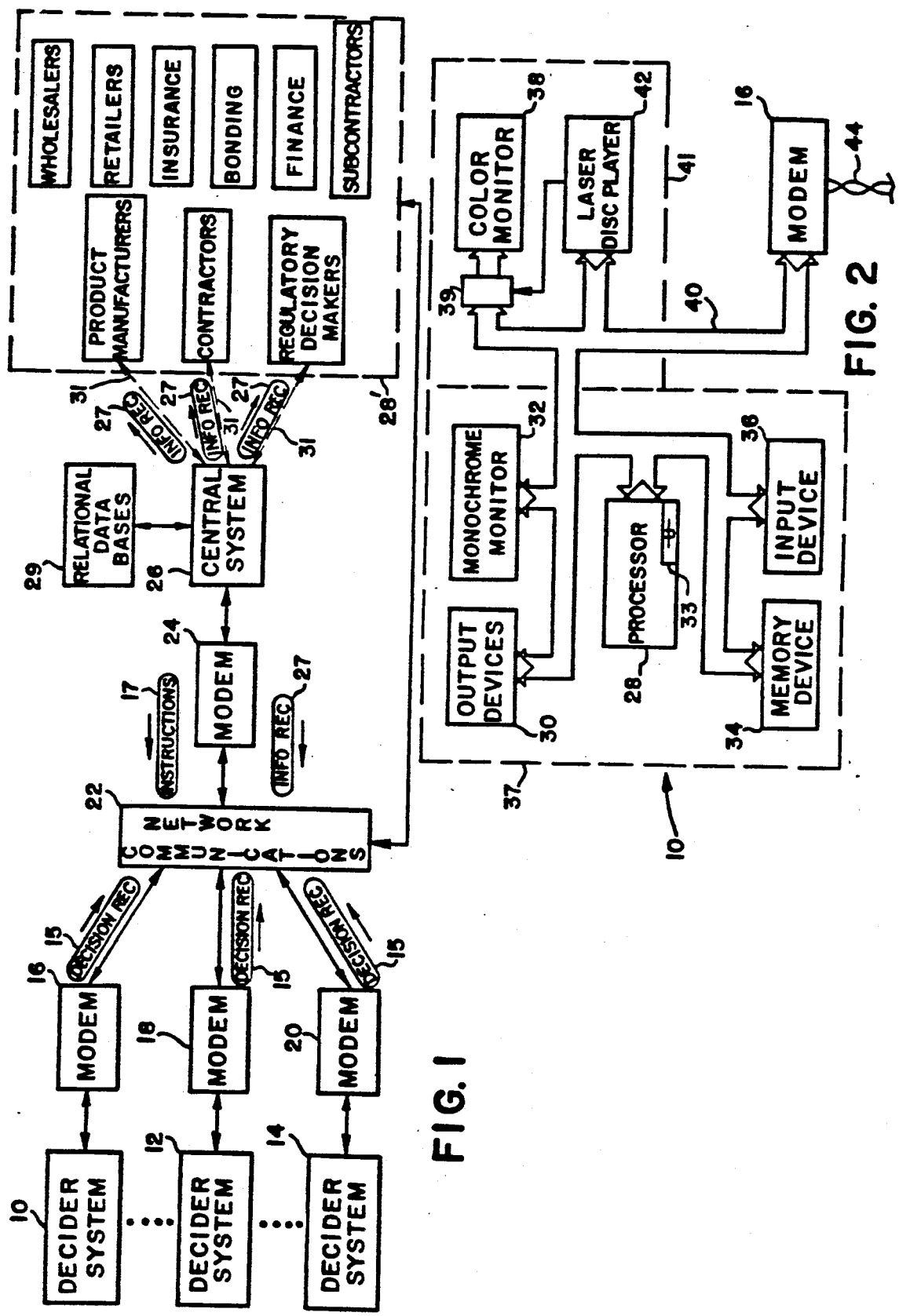

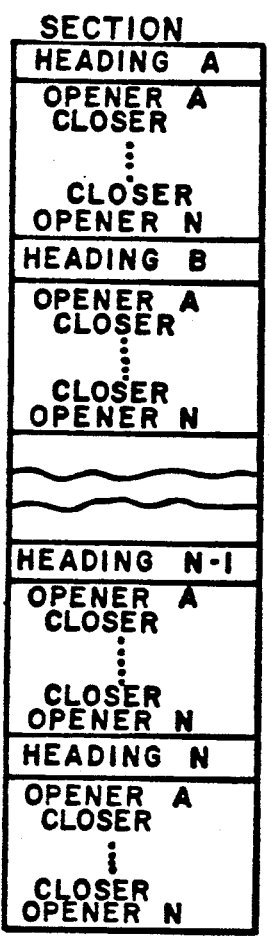
FIG. 6
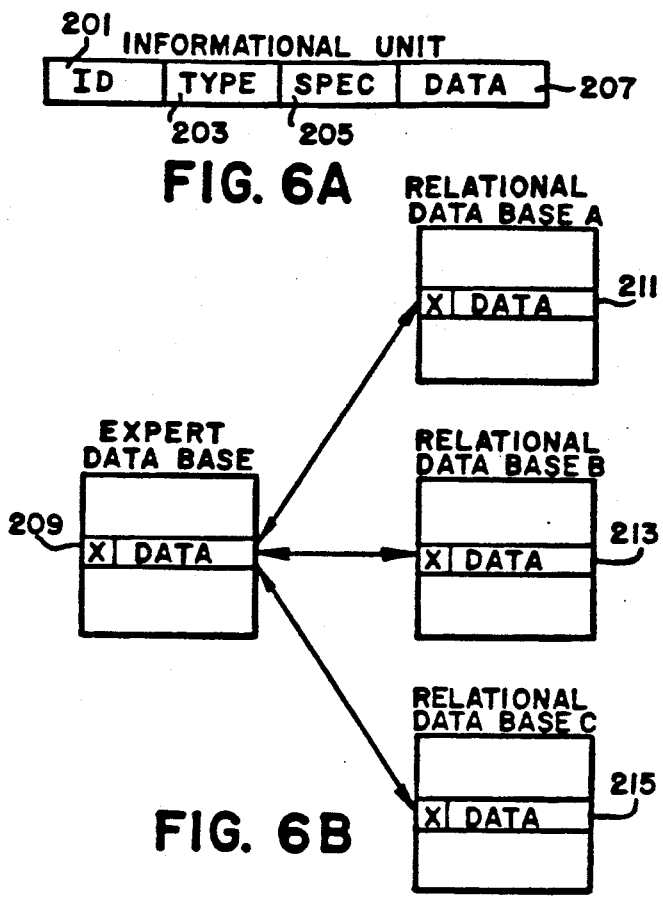
FIG. 6A
FIG. 6B
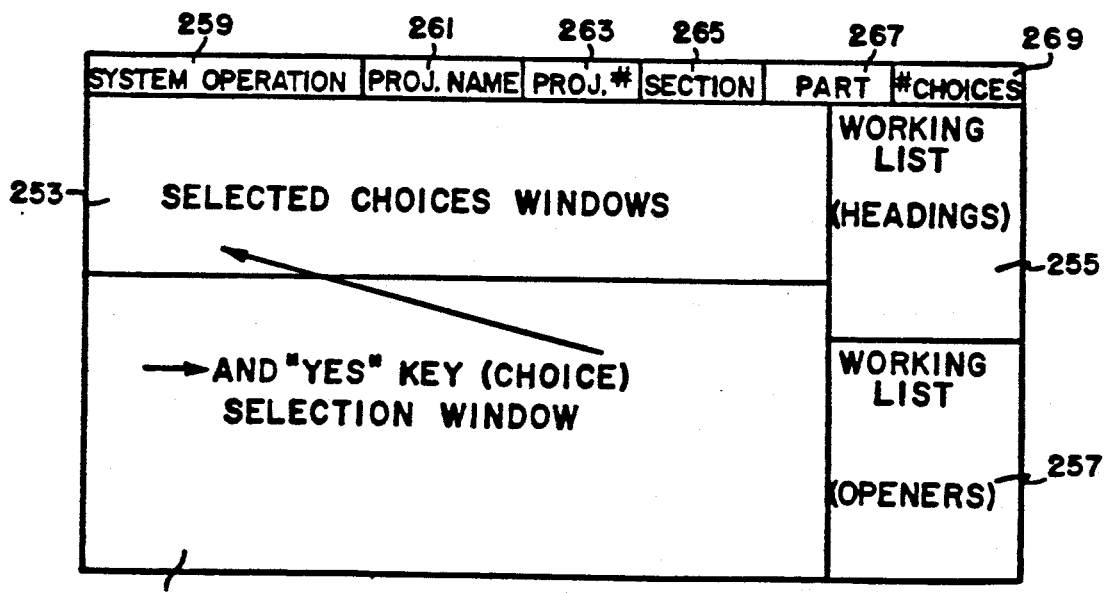
FIG. 7

```
00010 PRE-BID INFORMATION
00100 INSTRUCTIONS TO BIDDERS
00200 INFORMATION AVAILABLE TO BIDDERS
00300 BID FORMS
00400 SUPPLEMENTS TO BID FORMS
00500 AGREEMENT FORMS
00600 BONDS AND CERTIFICATES
00700 GENERAL CONDITIONS
00800 SUPPLEMENTARY CONDITIONS
00850 DRAWINGS AND SCHEDULES
00900 ADDENDA AND MODIFICATIONS

DIVISION 1-GENERAL REQUIREMENTS

01010 SUMMARY OF WORK
01020 ALLOWANCES
01025 MEASUREMENT AND PAYMENT
01030 ALTERNATES/ALTERNATIVES
01040 COORDINATION
01050 FIELD ENGINEERING
01060 REGULATORY REQUIREMENTS
01070 ABBREVIATIONS AND SYMBOLS
01080 IDENTIFICATION SYSTEMS
01090 REFERENCE STANDARDS
01100 SPECIAL PROJECT PROCEDURES
01200 PROJECT MEETINGS
01300 SUBMITTALS
01400 QUALITY CONTROL
01500 CONSTRUCTION FACILITIES AND TEMPORARY CONTROLS
01600 MATERIAL AND EQUIPMENT
01650 STARTING OF SYSTEMS/COMMISSIONING
01700 CONTRACT CLOSEOUT
01800 MAINTENANCE
```

FIG. 6C

```
MATERIALS AND USE LOCATIONS | BUILDING 10 | 1207 |03300|CLOSER|

WIRE FABRIC REINFORCEMENT A
WIRE FABRIC REINFORCEMENT B
FLEXIBLE WATERSTOPS
CURING COMPOUND

EXPANDED METAL REINFORCEMENT               253
INSERTS
ANCHOR SLOTS
ANCHORS
CEMENT RETARDING COMPOUND
CURING COMPOUND
→ACCESSORIES
 FLEXIBLE WATERSTOPS
 NON-SLIP SURFACING AGGREGATE
 HARDENER (DUST ON)
 COLORED CURING SEALER
 LIQUID CHEMICAL HARDENER
 EXPANSION JOINT FILLER
 BONDING AGENT
```

FIG. 7A

DIVISION 2-SITEWORK
- 02010 SUBSURFACE INVESTIGATION
- 02050 DEMOLITION
- 02100 SITE PREPARATION
- 02140 DEWATERING
- 02150 SHORING AND UNDERPINNING
- 02160 EXCAVATION SUPPORT SYSTEMS
- 02170 COFFERDAMS
- 02200 EARTHWORK
- 02300 TUNNELING
- 02350 PILES AND CAISSONS
- 02450 RAILROAD WORK
- 02480 MARINE WORK
- 02500 PAVING AND SURFACING
- 02600 PIPED UTILITY MATERIALS
- 02660 WATER DISTRIBUTION
- 02680 FUEL DISTRIBUTION
- 02700 SEWERAGE AND DRAINAGE
- 02760 RESTORATION OF UNDERGROUND PIPELINES
- 02770 PONDS AND RESERVOIRS
- 02780 POWER AND COMMUNICATIONS
- 02800 SITE IMPROVEMENTS
- 02900 LANDSCAPING

DIVISION 3-CONCRETE
- 03100 CONCRETE FORMWORK
- 03200 CONCRETE REINFORCEMENT
- 03250 CONCRETE ACCESSORIES
- 03300 CAST-IN-PLACE CONCRETE
- 03370 CONCRETE CURING
- 03400 PRECAST CONCRETE
- 03500 CEMENTITIOUS DECKS
- 03600 GROUT
- 03700 CONCRETE RESTORATION AND CLEANING
- 03800 MASS CONCRETE

DIVISION 4-MASONRY
- 04100 MORTAR
- 04150 MASONRY ACCESSORIES
- 04200 UNIT MASONRY
- 04400 STONE
- 04500 MASONRY RESTORATION AND CLEANING
- 04550 REFRACTORIES
- 04600 CORROSION RESISTANT MASONRY

DIVISION 5-METALS
- 05010 METAL MATERIALS
- 05030 METAL FINISHES
- 05050 METAL FASTENING
- 05100 STRUCTURAL METAL FRAMING
- 05200 METAL JOISTS
- 05300 METAL DECKING
- 05400 COLD-FORMED METAL FRAMING
- 05500 METAL FABRICATIONS
- 05580 SHEET METAL FABRICATIONS
- 05700 ORNAMENTAL METAL
- 05800 EXPANSION CONTROL
- 05900 HYDRAULIC STRUCTURES

FIG. 6C'

DIVISION 6—WOOD AND PLASTICS
- 06050 FASTENERS AND ADHESIVES
- 06100 ROUGH CARPENTRY
- 06130 HEAVY TIMBER CONSTRUCTION
- 06150 WOOD-METAL SYSTEMS
- 06170 PREFABRICATED STRUCTURAL WOOD
- 06200 FINISH CARPENTRY
- 06300 WOOD TREATMENT
- 06400 ARCHITECTURAL WOODWORK
- 06500 PREFABRICATED STRUCTURAL PLASTICS
- 06600 PLASTIC FABRICATIONS

DIVISION 7—THERMAL AND MOISTURE PROTECTION
- 07100 WATERPROOFING
- 07150 DAMPPROOFING
- 07190 VAPOR AND AIR RETARDERS
- 07200 INSULATION
- 07250 FIREPROOFING
- 07300 SHINGLES AND ROOFING TILES
- 07400 PREFORMED ROOFING AND CLADDING/SIDING
- 07500 MEMBRANE ROOFING
- 07570 TRAFFIC TOPPING
- 07600 FLASHING AND SHEET METAL
- 07700 ROOF SPECIALTIES AND ACCESSORIES
- 07800 SKYLIGHTS
- 07900 JOINT SEALERS

DIVISION 8—DOORS AND WINDOWS
- 08100 METAL DOORS AND FRAMES
- 08200 WOOD AND PLASTIC DOORS
- 08250 DOOR OPENING ASSEMBLIES
- 08300 SPECIAL DOORS
- 08400 ENTRANCES AND STOREFRONTS
- 08500 METAL WINDOWS
- 08600 WOOD AND PLASTIC WINDOWS
- 08650 SPECIAL WINDOWS
- 08700 HARDWARE
- 08800 GLAZING
- 08900 GLAZED CURTAIN WALLS

DIVISION 9—FINISHES
- 09100 METAL SUPPORT SYSTEMS
- 09200 LATH AND PLASTER
- 09230 AGGREGATE COATINGS
- 09250 GYPSUM BOARD
- 09300 TILE
- 09400 TERRAZZO
- 09500 ACOUSTICAL TREATMENT
- 09540 SPECIAL SURFACES
- 09550 WOOD FLOORING
- 09600 STONE FLOORING
- 09630 UNIT MASONRY FLOORING
- 09650 RESILIENT FLOORING
- 09680 CARPET
- 09700 SPECIAL FLOORING
- 09780 FLOOR TREATMENT
- 09800 SPECIAL COATINGS
- 09900 PAINTING
- 09950 WALL COVERINGS

```
┌─ 253
│ WIRE FABRIC REINFORCEMENT "A" | BUILDING 10 | 1207 |03300|OPENER|
│                                                    | WIRE FABRIC |
│                                                    | WIRE FABRIC |
│                                                    | FLEXIBLE WA |
│                                                    | CURING COMP |
│                                                    | CURING COMP |
│                                                    | CURING COMP |
│ REFERENCED INDUSTRY STANDARDS AND STANDARD SPECIFICATIONS:   255
│ TYPE:
│ MATERIAL:
│ FINISH:
│ SIZE:
│ BUNDLING TYPE:
│ USE THIS WIRE FABRIC REINFORCEMENT TYPE AT THESE LOCATIONS
```
251        257

FIG. 7C

```
                                              253
WIRE FABRIC REINFORCEMENT "B" | BUILDING 10 | 1207 |03300|
                                                         | WIRE FABRIC |
WIRE FABRIC REINFORCEMENT "B"                            | FLEXIBLE WA |
                                                         | CURING COMP |
CONFORMING WITH QUALITY STANDARDS SPECIFIED AND FOLLOWING:| CURING COMP|
                                                         | CURING COMP |
SAME AS DESCRIBED UNDER PRECEDING HEADING, EXCEPT AS FOLLOWS
  SIZE:                                                       255
    SPACING OF LONGITUDINAL WIRES ON CENTER IN INCHES:  G
      6                                                 E
    SPACING OF TRANSVERSE WIRES ON CENTER IN INCHES:    N    |SIZE|
      6                                                 E    USE THIS WI
    WIRE SIZE NUMBER FOR LONGITUDINAL WIRES:            R
      W3                                                I
    WIRE SIZE NUMBER FOR TRANSVERSE WIRES:              C
      W3                                                
    FABRIC WIDTH IN INCHES:                             P
       CONTRACTOR'S OPTION                              A
    FABRIC LENGTH IN FEET:                              C
       CONTRACTOR'S OPTION                              1
```
251       257

EXPERT INFORMATION SYSTEM AND METHOD FOR DECISION RECORD GENERATION

CROSS REFERENCE TO RELATED APPLICATIONS

The present application is a continuation-in-part of U.S. application Ser. No. 867,105 filed on May 23, 1986, in the names of C. W. Phillips, et al. and entitled "Expert Information System and Method for Decision Record Generation", now U.S. Pat. No. 4,835,683, which is commonly assigned with the present application. The disclosure of Phillips, et al. is hereby expressly incorporated by reference herein.

MICROFICHE APPENDIX

A microfiche appendix comprising one microfiche of 64 frames of software listings has been deposited with the specification in compliance with 37 C.F.R. §1.96(b).

BACKGROUND OF THE INVENTION

The invention pertains generally to expert information systems and methods which assist humans on making decisions, and is more particularly directed to an expert information system for decision makers in the construction, manufacturing, or similar industries who generate records of their decisions. The invention also specifically relates to method and apparatus for assisting other decision makers who use information from such decision records as a basis for their actions.

An architectural specification, or decision record, is a detailed set of correlated data and information for the various groups of personnel who perform construction work on a project as a result of the decisions made in the specification. These decision records are generally written by hand by an architect or specifier, i.e., a decision maker, as a description of the materials and construction techniques necessary to complete a construction of other project. Such specifications must be coordinated with others, usually on the staff of an architect, to generate multiple sets of information and coordinating directives for the various groups of people involved in construction a project. Such information and coordinating directives go to contractors, suppliers, subcontractors, etc.

The handwriting of a specification, or decision record, is extremely tedious and time-consuming because an architectural specification may run over a thousand pages for a large construction project. Further, during the planning and preparation of the construction drawings there may be changes to the decisions made where, as a consequence of these changes, modifications to the construction techniques and material descriptions need to be distributed to all persons involved in the work. It is quite difficult to insure that all modifications to the drawings are commensurately accounted for in the decision record and all necessary personnel are notified appropriately when the changes are handwritten.

Systems have been suggested which use a computer to assist in the preparation of architectural specifications. However, none of these previous systems have enjoyed any wide spread commercial acceptance. One of the disadvantages found in many of the present computer assisted systems is that the information from which an architectural specification is generated is simply a codification of the language used in handwritten specifications which are then compiled in paragraph form. Thus, a specifier or decision maker must locate a paragraph that conveys the exact meaning desired and then select it for inclusion in a specification. Such systems quickly become unwieldy because of the extremely large information data base required to convey the various nuances and difference meanings required for each decision in an architectural specification. Further, these previous systems are not easily adapted to incorporate new products, changes in present construction techniques, or modifications of the original architectural specification.

Moreover, the previous computerized systems do not provide a technique for reminding a decision maker that significant omissions from standard practice in a particular subject matter or category have been made. Neither can they insure that all the options which should be considered have been thought of by a decision maker. These systems, therefore, have no check on whether omissions, either by not realizing a possible option is available or by not making a decision on a option commonly used, have been made in the decision making process which can be detrimental to a construction project.

A substantial amount of the time used in decision making, particularly for architectural specification writing, is consumed in research. During the choosing of the selected construction materials and techniques, a decision maker may have to refer to reference manuals on national construction standards, other manuals on product advertisements and descriptions, and other materials about the selection of individual or groups of nonproduct decisions. The previous attempts at computerizing construction decision making have not significantly impacted or reduced this research time which is a major contributor to the cost and difficulty of generating these documents.

U.S. Pat. No. 4,370,707 issued to Phillips et al. discloses a computer system for generating architectural specifications and project control instructions. In general, a specifier uses brief symbolic characters representative of individual phrases from a master phrase catalog to mark decisions and phrase selections in a code on a printed order form. The information in the master phrase catalog includes construction materials, techniques, titles of references, testing, and industry standards which are correlated with instructional information and work assignments for various groups of people for a construction project. The code on the order form is keypunched onto paper cards and is then fed into a computer which is programmed to prepare a listing of the codes and to prepare an architectural specification from a group of specification data files.

Other expert systems are being used today to assist people in making decisions by using relational data bases. In many of instances, these systems merely allow a comparison of the decision making judgement of a person against an expert who has contributed his expertise to the data base. However, expert systems have not been used effectively to ensure that substantially all options of the decision making process have been reviewed.

Because of the cost and time consumed in decision making for large construction projects, it would be advantageous for a decision maker generating and documenting an architectural specification to be able to query and check his decisions against known expertise which has already proven to be successful, and to have a system which allows him to review substantially all of the available options of the selection process.

SUMMARY OF THE INVENTION

The invention comprises an expert information system with which a decision maker in the construction or a related industry can generate a decision record and related control instructions in a facile manner without significant omissions while ensuring that substantially all of the options available for making the decisions have been considered.

The expert information system includes a processor system which can access a data base which contains expert information on available decisions, techniques, standards, and other necessary information. The expert data base is structured in a predetermined manner to facilitate decision making. The data base is a segmented series of information units, preferably a title, a phrase, or sentence, which completely specifies one decision for the type of decision record being generated. The information units are then grouped as optional selections for different categories of decisions and grouped again as to subject matter, so that a logical tree like data structure is formed of many option levels. A choice at one option level produces a series of options at a next lower level until the desired decision can finally be reached by selecting one of the informational units on the lowest level.

In a preferred embodiment, the processor system includes a microcomputer which executes a system control program to select information from the expertise of the data base and to concatenate the individual units of information selected until an entire decision record is generated. The system control program further includes means for editing and storing the selected decisions and means for providing one or more hard copies of a decision record based on that data, such as from a printer or the like.

The control program which selects the information from the expert data base uses several visual display windows on a first display means, a monochrome monitor, to permit a real time and interactive implementation of the selection process. In one window, the system displays possible selections from the expert data base while contrasting that data with data in another window having a list of data indicating the decisions or selections already made. Special interactive command sequences are used by the decision maker to control the display and scrolling of the expert data in the selection window and the display and scrolling of data in the selected decisions window. A display pointer with a controllable position is employed to select lines and phrases of the expert information from that portion of the data base displayed in the selection window. The selection of such information causes the line or phrase from the data base, an information unit, to be transferred to the display of the selected decision window. The process of selection and transfer can be used to build a decision record of considerable length and complexity.

In addition, two extra auxiliary windows appear on the monochrome monitor to assist a decision maker where in one, the category of the data in the selection window is displayed to serve as a location indicator for the expert data base and where in the other, the identifiers of a particular sequence from the expert data base yet to be selected are displayed. These two auxiliary windows provide an easy monitoring of the level of the selection process for the decision maker while the system is in operation.

The system generally is used to select one information unit or make one decision at a time. However, another particularly useful feature allows the selection and appendage to the decision record of a preassembled sequence of decisions at one time. The sequence is a package of decisions which have been assembled for a particular option level and which correspond to typical choices for all lower levels of a selection thereby completely specifying the high level selection.

Another feature of the invention permits a decision maker to display information from another relational data base linked to a particular entry of the expert data base. The display of information may be notes about national standards, product advertisements or descriptions, or system assistance to aid in the decision process. The corresponding data can include associated sound segments with the video images. This corresponding data is preferably displayed or played on a second display means, a color monitor, and assists the decision maker in making correct decisions rapidly by showing advertisements of the products, text material, and product reference information which assists in making the decision.

This portion of the system considerably decreases the amount of time that the decision maker must spend in research because a library of information needed to assist in the making of his decisions is instantly keyed to the particular decision that is before him. This feature eliminates the need for the maintenance of large reference volumes of different product information and separate libraries of reference information pertaining to the selections.

The system, under regulation of the control program, also can append to the decision record an indication of the number of times a unit of information, or record, is accessed from the relational data base. As an additional feature, the time of the start of the access and when it ends for each relational information unit can be provided. The access duration and count for such information units can be extremely useful if the information unit is an advertisement because it will indicate the amount of viewing audience or circulation the advertisement has received. Other uses for the access count include being able to revise the expert data base and relational data base in accordance with the access frequency of an information unit. Those information units never accessed should possibly be omitted from the relational data base and those frequently accessed should possibly be added to the expert data base.

The system further provides a catalog feature to allow viewing of the relational data base through an index of the information stored. This feature allows the relational data base to be uncoupled from the decision choices so that a decision maker can browse through the reference material at any time without the necessity of making choices, in much the same manner one would use a catalog.

Another embodiment of the present invention includes a central processor system which is capable of communicating with a plurality of expert information systems, or decider systems, distributed at remote locations as needed by the decision makers. The central processor system communicates with the remote processor systems to receive the decision records which have been generated by each decision maker. From these decision records a multiplicity of data bases are accessed in a relational manner such that each unit of the expert data base corresponds to a corresponding item on at least one other data base.

In a preferred embodiment, the information from these relational data bases are used by the staff of the decision maker, to provide coordination between the decision record and related staff and employees. Preferably, the data is in the form of instructions to these personnel concerning the manner in which they are to implement the decisions. Such additional data about the many specific decisions will save time during their implementation.

Other relational data bases can be used to permit the accessing of information which can be used by persons peripheral to the involved industry in which the decisions were made. For example, information can be generated to manufacturers, wholesalers, and others about the products decided upon. Further, such relational data bases could be used to organize the work of suppliers by providing detailed information of all the decisions made which may affect their ability to become the selected supplier.

Still other relational data bases can be accessed in a linked manner to alert other decision makers about business opportunities in the formation stage of a project. This information can be updated and can comprise data bout firms who have requested decision information and intend to submit a bid for new business. This information would identify potential bidders for others who wish to sell products to these bidders. Numerous other data bases may be accessed in this manner to produce other valuable information records concerning the decisions made.

These and other objects, features, and aspects of the invention will be better described and more fully understood if a reading of the following detailed description is undertaken in conjunction with the appended drawings wherein:

BRIEF DESCRIPTION OF THE DRAWINGS

FIG. 1 is a system block diagram of an expert information system for decision record generation which is constructed in accordance with the invention;

FIG. 2 is a detailed block diagram of a processor system and auxiliary display system used by the decider system and central system illustrated in FIG. 1;

FIG. 6 is a detailed block diagram of the linked portion of the data base illustrated in FIGS. 5A-5C;

FIG. 6A is a pictorial representation of the format of an information unit for the data base illustrated in FIG. 6;

FIG. 6A' is a pictorial representation of the segmentation of the identifier for an information unit into a record identifier and a key identifier;

FIG. 6B is a system block diagram illustrating the linkage of the information units of the expert data base to information units of a plurality of relational data bases through an identifier field.

FIGS. 6C, 6(C)' and 6(C)" are a pictorial representation of the Construction Industries Association (CIA) standards for divisions;

FIG. 7 is a pictorial representation of a generalized screen display for the monochrome monitor illustrated in FIG. 2;

FIGS. 7A-7C are pictorial representations of the screen display of the monochrome monitor for various levels in the selection process;

DETAILED DESCRIPTION OF THE PREFERRED EMBODIMENTS

Figure 3:
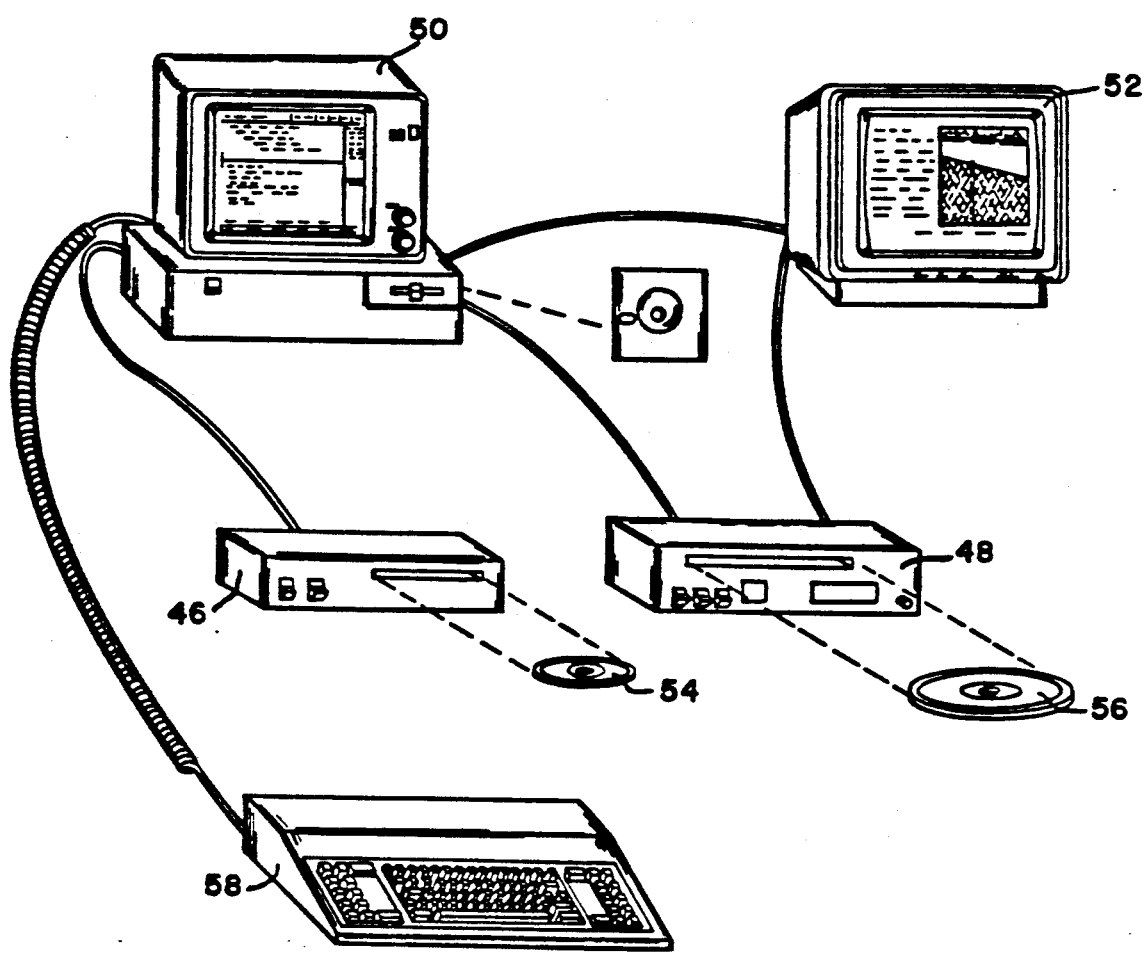
FIG. 3 is a pictorial diagram of a preferred implementation for the processor system illustrated in FIG. 2.

An expert information system for the generation of decision records 15 is more fully illustrated in FIG. 1 where a block diagram discloses a system constructed in accordance with the invention. The preferred implementation of the invention will be discussed with reference to the generation of an architectural specification for the decision record. However, it will be evident that other decision records could as advantageously be formulated for industries other than construction, such as manufacturing, education, financial, or the like. The system is applicable to any complex, multiple decision, planning process where a multiplicity of available options must be chosen from. The difference between such systems in other industries will be in the expert data base that formulates the knowledge of particular decisions for an industry.

The expert information system for generating decision records includes a plurality of decider systems 10, 12, and 14, each having a communications device of modem 16, 18, and 20, respectively. The decider systems are specialized data processing systems which can be remotely located from a central system 26. Such remote locations for the decider systems 10, 12, and 14 are chosen so that they provide convenient access for a plurality of decision makers. A common location would be the office of an architect, contractor, subcontractor, etc. The central system 26 is a specialized data processing system which can be conveniently located at any physical location because of its connection to the decider systems 10, 12, and 14 via a communications device or modem 24 through a communications network 22. Preferably, the central system 26 will be located such that the modem 24 can be connected conveniently to a suitable communications network 22, such as a telephone communications switch, and such that the central system 26 can provide information records 27 to a number of other decision makers or users 28 who base their decisions on information generated from the decision records 15.

The information records 27 may be supplied to these information users 28 via the communications network 22 or alternatively through other communication channels 31, for example, delivery by mail, courier, or the like. In addition, other information records 27 may be returned via the communication network 22 to each of the decision systems 10, 12, and 14 or via an alternative link 31 which may be used to provide certain information records 27 to the decider systems 10, 12, and 14.

Each decider system 10, 12, and 14 allows a decision maker to assemble a decision record 15 from an expert data base much easier and faster than has been previously possible. When the expert system is used to generate an architectural specification, the decision record 15 includes specifications on products and materials, and specific instructions on construction or manufacturing techniques. The decision records 15 are passed to the central system 26 where relational data bases 29 are accessed based on the selections made in a decision record to assemble the information records 27. The assemblage of the information records 27 is facilitated by using the relational data bases 29 where the entries or selections of the decision records 15 coincide or correspond to particular entries in the relational data bases. As a specific example, a decision concerning the use of a particular product or technique by a decision maker in the decision record will cause data corresponding to that product or technique to be accessed in the relationship data bases 29.

The output from the relational data bases 29 are for those personnel who are associated with a decision maker or have an interest in the decision process. In general, these people can include persons on the staff of the decision maker. Others interested in the decision record include the manufacturers of a product selected, wholesales, subcontractors who desire to obtain work based on a decision, regulatory agencies, planning agencies, etc. Such a system provides all those persons desiring or needing information about a specific decision with that information as it is selected by the decision maker.

In one preferred embodiment, an information record from the relational data bases 29 is used by the staff of a decision maker for coordination between them and the decision maker. Preferably, the data is in the form of instructions 17 to these personnel on the manner in which they are to implement the selected decisions. Such instructional data about many of the specific considerations of the decisions will save time and will prevent errors and omissions in the work and documents made by the staff.

A preferred embodiment for implementing a processor system 37 for each decider system 10, 12, and 14 is illustrated in FIG. 2. The implementation includes a microcomputer or processor 28 connected by means of data, address, and control busses 40 to a group of peripheral devices which assist in preparing the decision record. A floppy disk drive 33 is used for booting a loading program that allows the main control software to be run by the processor 28 and for storing the decision record 15. The main control software and the expert data base are relatively extensive in length, and, thus, are stored on a nonvolatile optical memory device, a compact disk read only memory (CD ROM) player 34. The CD ROM disc in player 34 provides a memory means which stores large amounts of data which can be quickly and easily accessed.

The control software is interactive and provides prompts and communications to the decision maker by a display means or monochrome monitor 32. The decision maker can respond to the communications by entering commands, decision selections, data, and requests on an input device, preferably a keyboard 36. Optionally, a hard copy of the results of the decision record 15 in various formats provided by the control program can be output by an output device such as printer 30. When a decision record 15 has been assembled by the processor 28, the control program communicates it to the central system 26 over a data line via a modem 16.

Further, the control program contains software which controls an auxiliary nonvolatile optical memory means including a laser disk player 42 and a second display means or color monitor 38. The laser disk player 42 includes a memory means in the form of a video disk storing a multiplicity of video frames of visual and/or textual information. These video frames can further include associated sound segments. Upon control signals generated by the processor 28, the video frames of visual or textual data and sound segments can be displayed and played on the color monitor 38. The data base from which these video frames are taken is comprised of another relational data base storing manufacturer and product information, reference notes, and assistance information for the decision maker.

In general, each decider system, for example that shown at 10, includes a processor system 37, the auxiliary memory means 41, and a modem 16. The central system 26 comprises a processor means 37 including one or more memory devices, such as CD ROM player 34, on which to store the relational data bases 29 and the modem 24.

FIG. 3 is a pictorial illustration of a processor system 37 and auxiliary memory means 41 implemented by component equipment which is commercially available. The processor 28 and keyboard 36 are preferably included in an IBM PC-XT microcomputer system 52 having at least 640K of RAM. Further, the microcomputer 52 is equipped with a hard disk with 10 megabytes or more of storage and one 5¼ inch floppy disk drive 33. Additional options included in this system are a controller card and device driver software for the CD ROM player 34. An RS 232 communications card is used to control the laser disk player 48. A line printer control board and monochrome display adaptor with a real time clock are included as further options of the microcomputer 52. The microcomputer 52 is also equipped with an asynchronous serial communications port compatible with RS-232-C communications protocol for the modem 16. The microcomputer system 52 runs under a PC DOS, version 2.10 or higher, operating system.

The CD ROM player 34 is a model CDR-1502S manufactured by Hitachi of Tokyo, Japan which provides digital information to the microcomputer 52 from a 522 MB compact disk 56 storing the system control software and the expert data base. The laser disk player 42 is a model LD-V6000 distributed by Pioneer Video, Inc. of Montvale, N.J. which supplies the color monitor 38 with video data in the form of visual and textual display from a laser disk 58 which contains a relational data base of video frames linked to informational units of the expert data base.

The monochrome monitor 32 is a model number 310-A manufactured by Amdek Corporation and controlled in a well known manner by the microcomputer 52. The color monitor, 60 is a model number CTF- 1465R manufactured by Panasonic Corp. of Japan which is controlled in a well known manner by the laser disk player 48 and which in turn is regulated by the microcomputer 52.

The printer 30 can be any Epson compatible printer using Epson-like command codes connected in a conventional manner and communicating with the microcomputer 52. Each of the modems 16 and 24 is a model number SM-12PC manufactured by QUBIE Corporation which communicates data in a serial manner at 1200 baud over a standard telephone connection.

Figure 4:
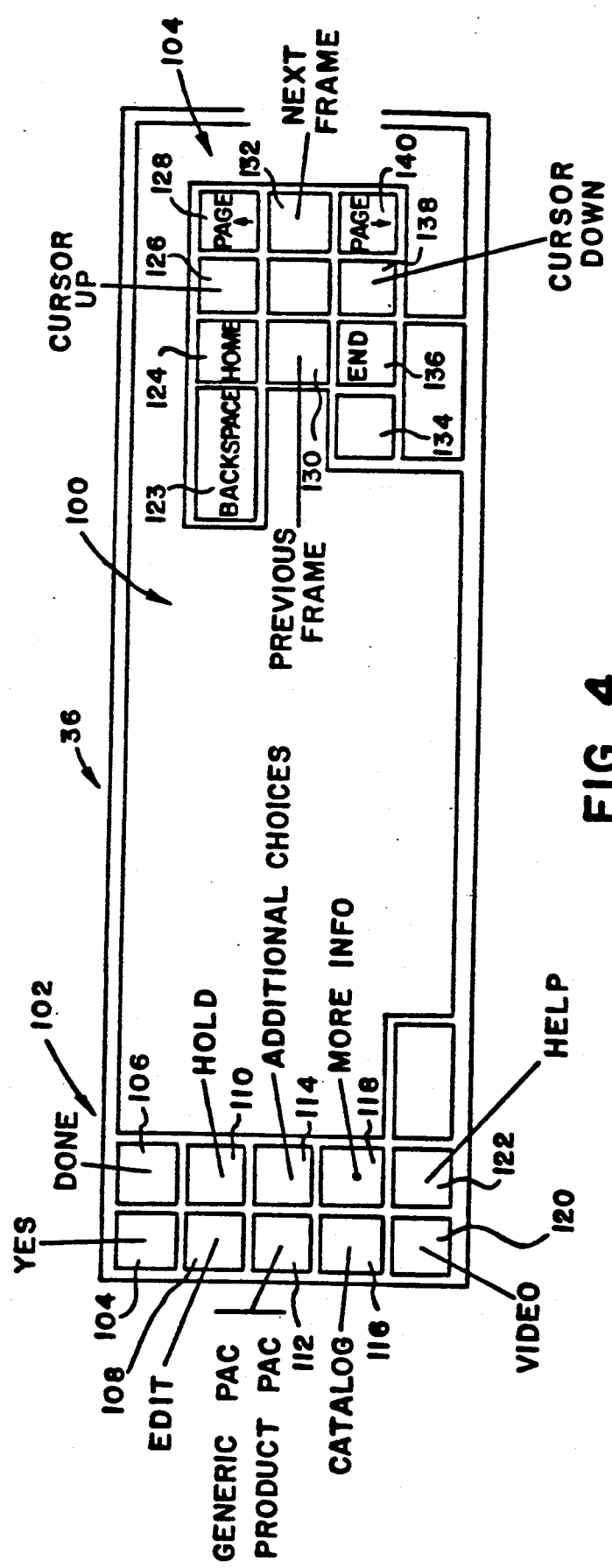
FIG. 4 is a pictorial representation of the key function layout for the preferred input device of the processor system illustrated in FIG. 2.

Referring now to FIG. 4 there is shown a implementation of the input device 36 which preferably comprises a standard IBM PC-XT keyboard. Normally, such keyboards have regular alpha-numeric keys and punctuation located centrally at segment 100 and a number of special keys on a left hand segment 102 of the regular keys which can be defined for special software functions. The keyboard further includes a special group of keys on a right hand segment 104 used for control and positioning of the display of the expert data base, positioning of a display pointer on monochrome monitor 32, and control of the video on color monitor 38. Such specially defined keys are conventional and can either be software implemented or hard wired to develop particular signals. In the present system such keys are mapped in the control program to define specifically designated system functions.

Beginning with the left segment 102, a "yes" key 104 is used by the system to select choices. By moving the display pointer to a particular choice on monochrome monitor 32 and by depressing the "yes" key 104, an operator has a facile means for selecting many choices from a large data base very quickly and efficiently. The procedure is to merely move the display pointer to a choice on the display area and affirm the selection with the depression of the "yes" key 104. A "done" key 106 is used for expressing the desire of a decision maker to end a particular function or module, and to move from level to level. As was described previously, the control program of the system is menu driven and once a function has been completed operating the "done" key 106 will provide a means for shifting back to a main menu for selection of another operation. The "done" key in this manner is used to move between levels so that even if the program is nested into its lowest level, the decision maker can move easily to the highest program level by serially pressing the "done" key until the program has determined that the entire operation is finished.

The decision maker at times needs to refer to other text or video information on the color monitor 38 or wants to check other material on the monochrome monitor 32 while in the decision making process. To save his position in the decision process which may be nested down several levels, a "hold" key 110 is used. By pressing the hold key 110 with one stroke a position in the decision making process of a particular project is remembered. Thereafter, the operator may do any number of other tasks before coming back to the place in the decision process he left.

An "edit" key 108 is provided for placing the system into an edit mode such that textual material of a decision record may be displayed and edited similarly to conventional word processing routines. The edit mode uses a word processing program to allow the text of decisions to be moved, rearranged, deleted, and added as the need arises from the decision maker. In effect, the edit mode allows the decision maker to use the system as a report generator and letter writer to further process a decision record.

Further, in the option keys 102 there is a "catalog" key 116 which provides the system with a catalog function. The pressing of the "catalog" key 116 will transfer the system out of whatever mode it is presently in and into a catalog mode where an index of all the manufacturers and products stored on the video disk 56 are displayed. The operator can by moving the display pointer and browsing through the text of the index, select one or more product frames for viewing on the color monitor 38. To return from the catalog mode the "done" key 102 or the "catalog" key 116 is pressed.

If more information is desired about any product than is presently available on the video disk 56 or is in the index to the catalog, then a "more info" key 118 is pressed. The "more info" key 118 causes the processor 28 to alert the central system 26 that this particular decision maker is interested in additional information relating to a particular product. There are a number of choices to select from for more information such as technical assistance, personal contact from the manufacturer, a price quotation, or a sales call. The decision maker can request this assistance automatically while continuing work on the project. The central system will append the request to a decision record 15 and, by means of an information record 27, will alert a manufacturer 29 of the request, what assistance is necessary, and to whom it is to be delivered.

Further, provided in the operational segment keys are a "generic or product pac" key 112. "Product pacs" are a complete set of specifications about a product of a specific manufacturer which can be selected and completely specified with only a few decisions relating to the options which are available with respect to choosing that product. For example, a paint product or a full elevator system of a particular manufacturer could be specified with a few key strokes. The documentation produced by the system will contain all of the necessary technical detail for the specification. If the package of the selected documentation is not manufacturer specific, then the pac is termed a "generic pac" rather than a "product pac".

The video disk player 42 and color monitor 38 provide access to an auxiliary data base which is related or linked to a particular closer or product information. This linked data base is accessed by pressing the "video" key 120 located on the right segment 102 of the input device 36. Associated sound segments are also stored on the video disk and are automatically accessed when the video images are displayed. Several sequential images may be displayed to provide moving images similar to a movie. In general, the "video" key will cause the display and playing of information corresponding to the product or a closer pointed to by the display pointer on the monochrome monitor 32.

For example, a product such as a door could be shown pictorially with all of its technical specifications on the color monitor 38. If the closer is a standard such as an ASTM standard, depressing the "video" key 120 will call a condensation of significant parts of the standard onto screen of the color monitor 38. The associated sound segments can be used to explain the video portions, to be entertaining, or to provide special key information about the note. In this manner, the auxiliary memory means 41 acts as a reference library which is instantly linked to a particular decision at hand and saves the operator time in locating particular reference material from a large data base contained in many volumes.

Further, there is a "help" key 122 which permits messages to be displayed on the color monitor 38 for assistance to the operator. The pressing of the "help" key 122 will cause the display of a message indicating the present system mode and what the operator must do to move to another different mode or to obtain further assistance messages.

The right hand segment 104 of the keyboard 36 contains a number of keys 124-140 which are used as control keys to move the display pointer, position a part of the data base displayed on the monochrome monitor 32, and control the information displayed on the color monitor 38. Keys 124, 126, 136, and 138 are used as control keys for the display pointer. The "home" key 124 moves the display pointer to the top of a displayed data base part, while the "end" key 136 moves the display pointer to the bottom of a displayed data base part. The display pointer can be moved up or down one line or selection at a time by pressing the "up" key 126 or the "down" key 138, respectively. Further, full pages of text for display can be exchanged on the display area by pressing the "page up" key 128 or the "page down" key 140. The "page up" key replaces the presently displayed page on the monochrome monitor with the previous page of the data base while the page down key advances the display to the next page. Similarly, the keys 130 and 132 allow a control of the video information on the color monitor. "Previous frame" key 130 allows the video monitor to display the image of the previous frame of the auxiliary data base, while the next frame key 132 advances the image displayed on the color monitor to the subsequent frame. The "video" key 120 displays the first frame of a group of frames relates to a particular possible decision and the keys 130 and 132 allow the viewing of any one of the several of these frames.

Figure 5A:
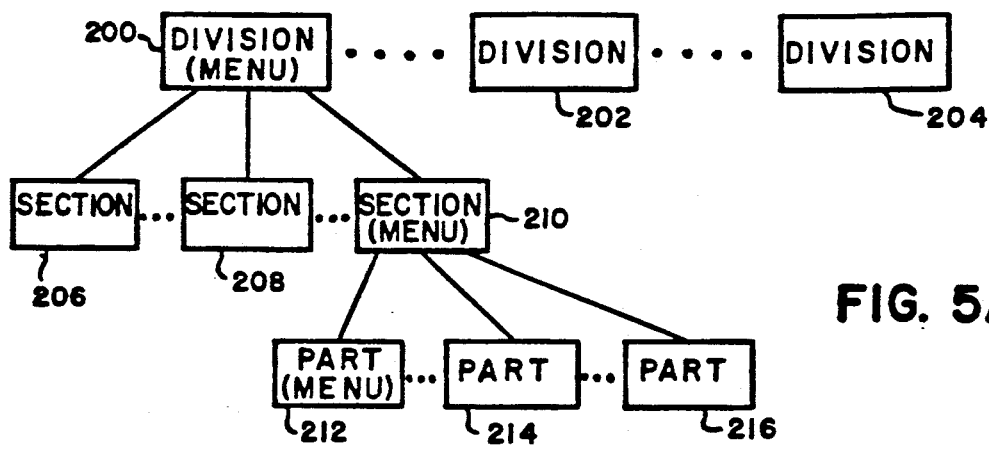
FIGS. 5A-5C are block diagrams illustrating the format of the expert data base stored in the memory device illustrated in FIG. 2.
Figure 5B:
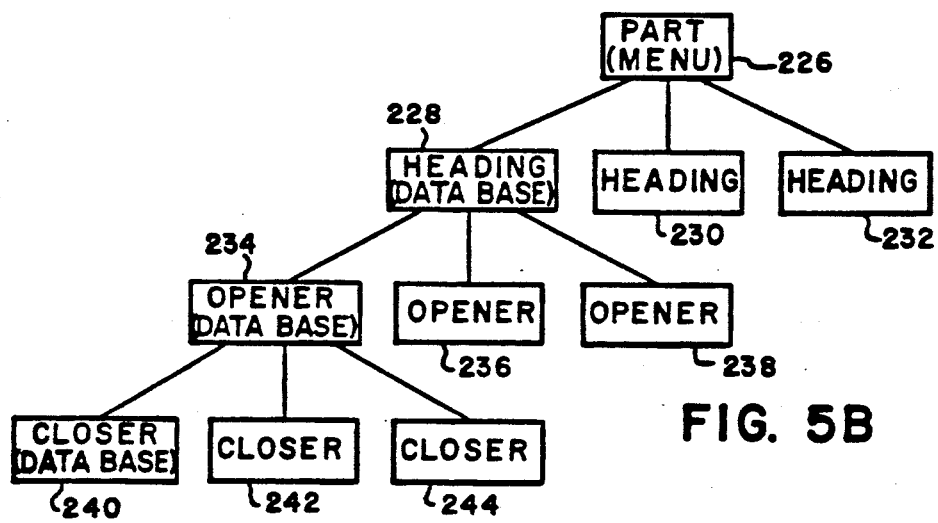
Figure 5C:
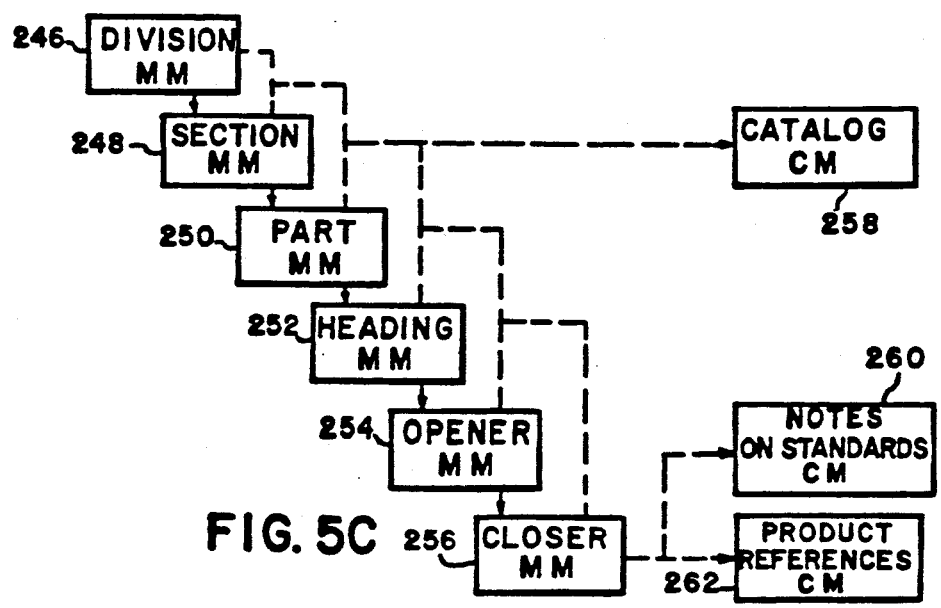

The structure and format of the expert data base is illustrated in FIGS. 5A, 5B, and 5C. The expert data base comprises several menus which are linked to formatted data on the CD ROM disc 54. The expert data base is formatted in this manner to allow an operator or decision maker the ability to review all relevant choices that are available, and also to organize the data into a structure that can be easily assembled into a decision record. The data base is structured as a tree like assembly of option levels until a final decision can be made by a single choice at the lowest level.

The menu portion of the expert data base is stored on the CD ROM disc 54 and comprises a plurality of division menus 200, 202, and 204; a plurality of section menus 206, 208, and 210; and a plurality of part menus 212, 214, and 226. Thus, a decision maker is given a group of division choices and requested to chose one of the divisions by moving the display pointer to point at a particular choice. This action will, when coupled with the pressing of the "yes" key, cause the selected division menu, for example 200, to display a plurality of section labels. The menu can then be selected from to pick a particular section, for example 210, by again moving the display pointer to where it points to a section name and gain pressing the "yes" key. The selection of a section name will cause a part menu for that section to be displayed. The selection of a part name is again accomplished by moving the display pointer to where it points to the particular part desired and by pressing the "yes" key.

A part menu, for example 226, illustrates a number of headings which can be selected by moving the cursor to point to a particular one and then by pressing the "yes" key. The headings are information entries of the actual expert data base stored on the CD ROM disc 56. The expert data base is comprised of a multiplicity of headings, for example headings A, B . . . N, as illustrated in FIG. 6 which contain blocks of statements or choices which will be termed openers and closers. Upon the selection of a heading, a number of openers 234, 236 and 228 associated with that heading are selected by pointing to them with the display pointer and pressing the "yes" key to form part of the architectural specification. Linked to each opener are a plurality of choices to fulfill the opener specified, such as closers 240, 242, and 244.

This structure of option levels allow the decision maker an advantageous structure with which to specify an actual decision. The decision maker starts with general options and then chooses between options which more specifically describe the decision that is being made. Once an option is chosen, the next more specific level of choices is made available. This process continues until the decision can be completed by selecting one information unit from the final level, the closer. This decision process based on the data base structure is applicable to many expert data systems and decision processes. The data base is a segmented series of informational units, preferably a title, a phrase, or sentence, which completely specifies the final decision for the type of decision record being generated.

FIG. 5C better illustrates the six levels of options or selections for the data base. The division level being the highest or most general and the closer level being the most specific and the final level. It is noted that the catalog function 258 of the system can be entered from any level and thus, is not linked to the data base structure. However, the reference material such as the notes on standards 260 and product references 262 are linked to specific information units at the closer level.

The system when a section is chosen loads all the informational units (headings, opens, and closers) for that particular section (FIG. 6) into the RAM of the processor 28. This portion of the data base can then be displayed and manipulated by the system in making the choices for the decision record. The processing of the informational units of a section is facilitated by the data format illustrated in FIG. 6A where every information unit is comprised of a unique tag or ID field 201, a type field 203, and a further specification field 205. The actual data is that included in a data field 207. The fields of the informational units are useful for a number of purposes such as sorting and list processing of the data in a section. For example, to determine a list of all the heading selections for display, the system compares the type field to a heading specifier and stores a list of all the units found with that type. This list can then be displayed for the heading option level. In addition, the spec field can indicate whether the unit is of a special type such as a product or manufacturer. Thus, all the manufacturers of a particular heading, or all the products of a particular manufacturer could easily be sorted from the data base.

As seen in FIG. 6A', the identification field 201 is segmented into two parts, a record identifier and a key identifier. The record identifier is a number which indicates the offset of the information from the start of the data base and the key identifier is a number unique to the information itself and is used to relate it to other information. With the record identifier, the selection process can be used to store this identifier to the decision record instead of the entire information unit thereby greatly saving space. When the decision record is displayed the stored record identifiers are decoded and that information displayed from the expert data base.

Another important use of the descriptor fields is in the relation or linking of one informational unit on one data base to another information unit on another data base. Because of the unique identifier of each informational unit on the expert data base, links to other informational units can be made by assigning them the same identifier. In FIG. 6B, there is illustrated an expert data base and several relational data bases A, B, and C. An informational unit 209 of the expert data base is linked to informational units 211, 213, and 215 of the respective data bases A, B and C by using the same key or tag X in the identification field X. This linkage is used to speed retrieval and provide rapid accumulation of the related data once a decision record is generated. The identifier labels for informational units in a decision record can be matched against one or several relational data bases and those matching a linked information units retrieved for a report. The identifier field further permits the rapid retrieval of video information from the auxiliary memory means 41. The video frames or informational units are linked in the same manner where an identifier label on the frame is matched or linked to a decision (information unit) on the expert data system. In response to the "video" key, the system reads the identifier label of the information unit pointed to by the display pointer and retrieves the linked video frame with the same label for display on the second monitor.

The menu selection is used to rapidly locate the desired data on the CD ROM disc 54 and the heading opener and closer structure of the data base allows a single place for all decisions to be made for that particular heading. Because all choices are provided for the decision maker, there is no necessity that he remember every option so that none are overlooked. Because many times the heading of one part of a section and division may be similar or require similar choices as another part, the headings, openers, and closers for a particular part are self contained. In other words, the sentences or selection choices may be repeated many times in the data base but are in the particular place in the option chain where that decision will be accomplished.

There has been described in general the format and selection of the expert data base which will now be more explained in detail as related to a architectural specification generation system. A division in the data base for architectural specification generation can apply to a major classification of work such as that done by a group of people having a related craft. For example, preferably the division menu comprises the sixteen major classifications of the Construction Standard Institute (CSI) as reproduced in FIG. 6C and one special division. The section segmentation can be a specification based on a craft or contractor such as that done by an electrical craft, plumbing or concrete, etc. The part division of the present format divides the work that the craft or contractor will do into three parts. In one of the parts is a definition or introduction to the particular division of the labor which is being specified. The second portion of the part division are materials and use locations which indicate what materials are to be used and where are they to be used. The third portion of a part division is the detail for execution of the construction or the installation of the material chosen.

The heading specification relates to the class of materials chosen in the second portion of the part division and can be further described by the openers and closers. An opener, therefore, describes or is a selection of characteristics that concern or specify a particular material such as strength, type, color, or all other methods for specifying the material, as by ASTM standard or product number, etc. The closers are the answers to the characteristics chosen for the material. Approximately 80% of the expert data base is occupied by the choices at the closer level.

The display of the monochrome monitor 32 is split for convenience into a group of sections or windows as is shown in FIG. 7. The illustration shows a header line and four windows in a preferred embodiment but this can be increased or decreased as the need arises. In general, there is a window for the headings of a section being worked on, a window for the openers of a heading being worked on, and a window for the selection area for closers of an opener being worked on. The fourth window is reserved for selected choices of the closers displayed in the selection window.

Preferably, a selection window closest and most central to the view of the decision maker is used to display a plurality of choices, in this example a plurality of closers. It is in this area that the decision makers moves the display pointer to choose a particular line from the possible choices. By then pressing the "yes" key the chosen selection is moved from the selection window to a selected choices window. Once in the selected choices window the choice becomes part of the decision record, i.e., an architectural specification.

For long sequences of choice selections the "page up" and "page down" keys allow the decision maker to scroll through the choices with the selection window. Each page of a group of decision choices is replaced by another page upon command. An automatic scrolling of the selected choices window permits a view of the most recent choices which are inserted at the bottom of the window. The data from previous choices is then scrolled off the top of the screen as additional choices are made.

Two auxiliary windows complement the two main select and selected choices window. The first window displays a list of the headings chosen for a particular section which must be filled in. The particular heading presently being filled is highlighted such that the decision maker knows the information being worked on at that level.

The second window is a working list of the openers that apply to the particular heading under consideration. This word at the opener level is additionally highlighted similar to the opener. Thus, in this mode the selection window will contain a list of options or choices which apply to a particular opener for a particular heading. The selections are made by moving the particular closers selected for the highlighted opener to the selected window. When all closers for the highlighted opener have been chosen, the decision maker presses the "done" key and the next opener on the list in the auxiliary window is highlighted. Thereafter, related closers are displayed in the selection window and the selection process takes place as previously described.

After all the openers of a particular heading are filled in, an operation of the "done" key will erase the particular highlighted heading that the decision maker was working on and highlight the next heading in the list displayed in the first auxiliary window. This causes the openers selected for that particular heading to be displayed in the second auxiliary window and the end opener of that list to be highlighted for work. The closers of the particular opener highlighted are then displayed in the selection window. Each heading can be filled out as previously described.

The header section of the display of monitor 32 is divided into a number of sections which give the decision maker information on the level and status of the present term on the decision display. In the first part of the header line there is a reserved space for a description of the system operation the system is presently performing, such as sections choices. In the next portion of the header line, the project name and project number are listed. After the project identification, the particular section being worked on is displayed in part. A two digit section ends the header line with the number of choices presently available for the particular level the decision maker is working at.

FIG. 7A illustrates the selection of a number of headings for a material and use locations part for the building 10 project which has a project No. of 1207. The section of the specification being worked on is 03300. The decision maker has chosen four headings in the selected choices window. The last selection was the heading "curing compound" which the display pointer is pointing to in the list of possible selections.

In FIG. 7B the decision maker has finished selecting the list of headings and has started to select a number of openers from the list in the selection window 251. These openers are those options which apply to the first highlighted heading "wire fabric reinforcement A" in the list of window 255. The process is shown at a later stage in FIG. 7C, all the openers for each heading have been chosen and the closers for the first heading WIRE FABRIC Reinforcement A have been chosen. The process is now in the selection of closers for the opener "size" of the second heading "wire fabric reinforcement B". Further, it is illustrated in the figure that there is a "generic pac" associated with the opener highlighted in window 257.

Figure 8:
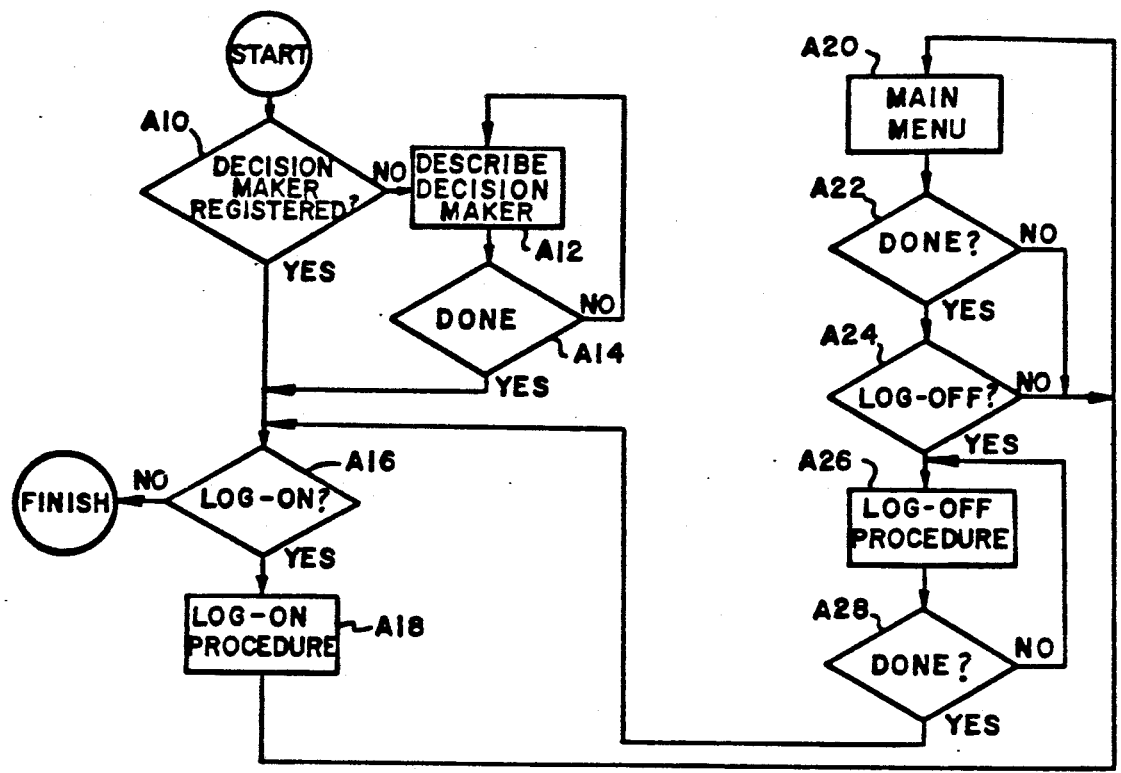
FIG. 8 is a system flow chart of the control software which controls the processor system and auxiliary display system illustrated in FIG. 2.

In FIG. 8 there is shown a system flow chart of the software which controls the operation of the specification generation system. In Appendix A there are related screen representations of displays of the system on monitor 32. Initially, after a project disk is loaded in the disk drive 33 and control is transferred by the operating system to the system program, the software in block A10 decides whether the decision maker is registered. This operation can consist of any number of levels of protection including passwords and/or different priorities of passwords. In the present system, there will be a firm or project leader who has access to any data on the decider system and other decision makers such as architects employed by the project leader who may only work on and have access to specific projects. If the decision maker is not registered, then a loop including blocks A12 and A14 are entered such that the firm and its decision makers can be described on the system.

The firm description process can be limited to those with higher priority passwords so that a person who can only access one project will not be able to describe the decision makers of an entire firm. When the description of the group of decision makers are complete, the "done" key is pressed and recognized in block A14 to transfer the program to block A16. A log on procedure is then initiated in block A16 whereby after the decision maker is registered he is required to execute a log on procedure such that the system can identify each of its uses as to a time, and decision maker. The screen of page A1 of the Appendix illustrated a group of log on choices for a firm. If the decision maker does not want to log onto the system, he presses the "done" key and the negative branch of block A16 transfers control back to the operating system.

Otherwise, after the log on procedure, in block A20 a main menu of nine major function choices is displayed on the monitor 32 for the decision maker. The decision maker can choose from this main menu page A2 of the Appendix and the modules associated therewith until he is finished using the system at which time he proceeds to press the "done" key which is detected in block A22. Alternatively, the program loops back through block A22 to the main menu to display further choices when any one of the modules is terminated.

The system then queries the decision maker in block A24 whether he desires to log off or return to the main menu. Depending upon the answer to this prompt, either the main menu block A20 or the log off procedure in block A26 is accomplished. The log off procedure in block A26 includes a transfer of information (the decision record) to the central system 26 such that it can link the transferred data with one or more particular relational data base 29 and send to the other associated decision makers 28 information records 27 (FIG. 1). After the log off procedure is completed, the program will loop back to block A16 where the system will request either a log on operation or a finish response.

Figure 9:
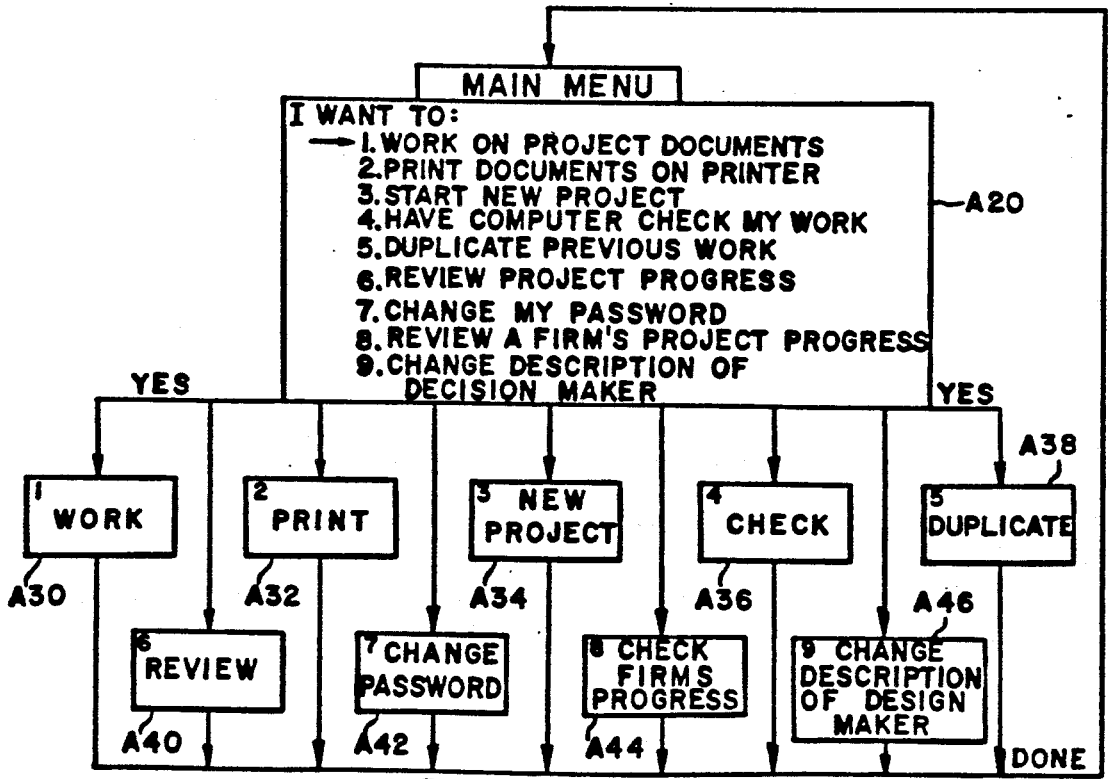
FIG. 9 is a pictorial representation of the main menu and associated software modules of the program block illustrated in FIG. 8.

FIG. 9 is a pictorial representation of the main menu illustrating the major functions of the system. The first choice is to work on project documents which is the primary operation used for actually assembling an architectural specification. The second choice, print documents on printer, allows a hard copy output of an architectural specification or a report to be taken from the project file on the disk drive 33 and printed according to specialized formats. The third choice, to start a new project, includes an interactive program which prompts the decision maker into filling in the data needed to initiate a new project on the system.

A fourth choice is provided which allows the decision maker to have the processor and control program check his work. This checking program allows a high speed data match against the expert data base. For example, the program will pick up discrepancies where divisions or important sections have been omitted and prompt the decision maker to fill these in. The decision maker always has the ability to reject the suggestions of the system but he is still reminded to those parts of the specification that nearly everyone includes. The check is to prevent the decision maker from forgetting an important part of the specification, but not to require him to include it in the final printed document.

A fifth choice includes an operation that allows an architectural specification to be duplicated. This operation copies the project documents to a new file which can then be edited or changed as the case may be. This will allow a shell of an architectural specification that was generally used by a firm or in one project area to produce documents from a form stored on the system. A sixth choice allows a decision maker to review particular projects in progress. The review will alert the decision maker which divisions and sections have been completed and which are still necessary to be chosen. The next choice, is a method of changing the password for the decision maker. The password may be changed by the project leader or that person associated with the password. Another choice labelled eight is an operation which allows a review of the firms project progress. A last choice on the main menu is to allow the editing or modification of the description of the decision maker.

The decision maker chooses one of the functional operations of the system to work on by moving the cursor to where it points to one of the nine choices. After selecting a particular choice, the decision maker then presses the "yes" key to transfer control of the program from the main menu to the particular module associated with the task. Modules A30-A46 are associated with tasks on the main menu A20 labelled 1-9, respectively. Whenever a module or task is completed, the "done" key is pressed which transfers control of the system back to the main menu. While at the main menu the depression of the "done" key will take the system out of the menu operation and transfer it to the log off procedure as previously described.

Figure 10:
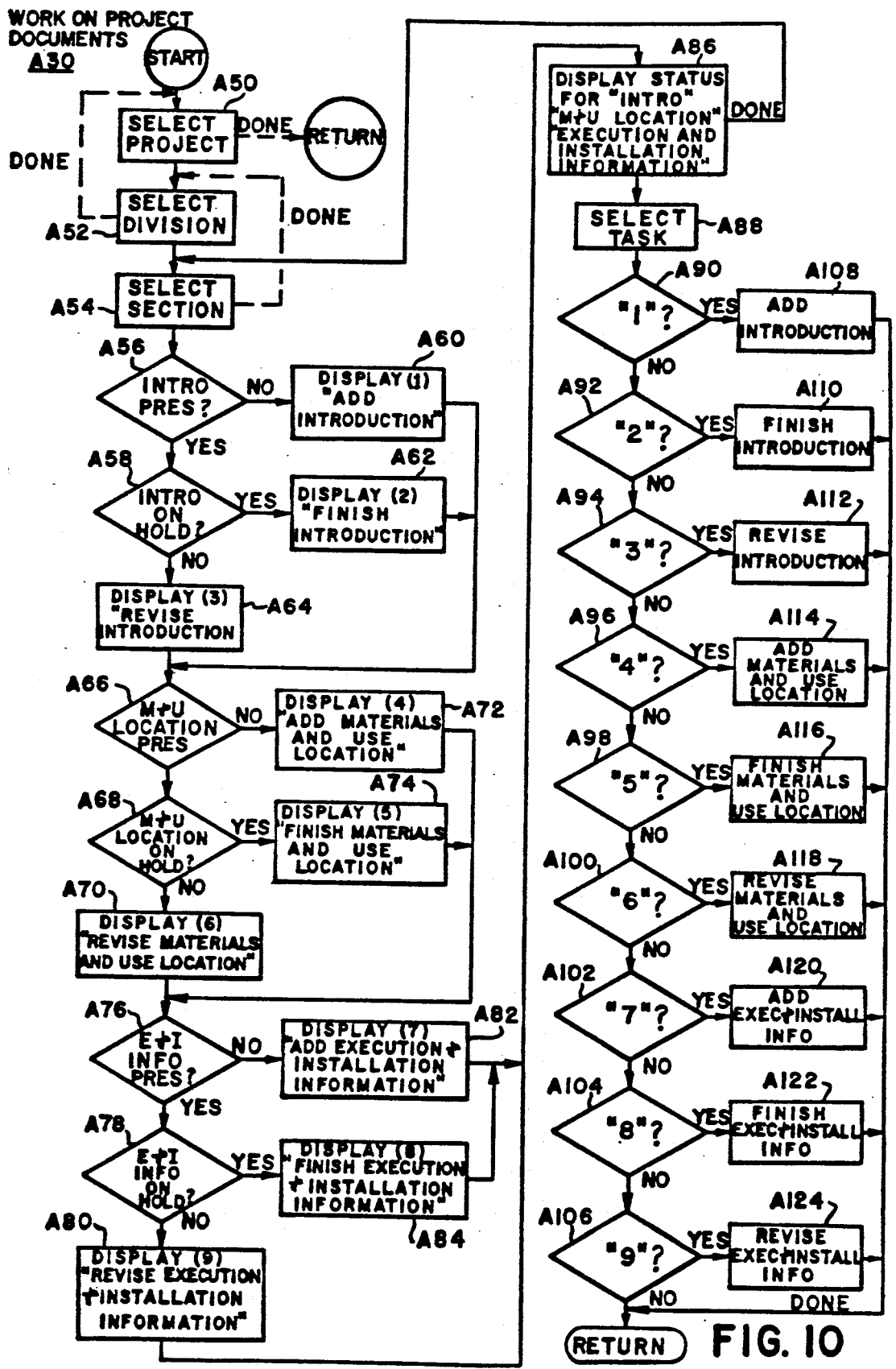
FIG. 10 is a detailed flow chart of the work on project documents module illustrated in FIG. 9.

A more detailed block diagram of the work on project documents module is illustrated in FIG. 10. After the decision maker has selected the operation to work on the project documents, the system will initiate the program illustrated in that figure. Initially, in block A50 the program prompts the operator to select the project that he desires to work on. From that project, he will then obtain the division menu in block A52 and the section menu in block A54. From these selection menus he will select the particular section of a division of the project that he desires to work on. Pages A3, A4 of the Appendix illustrate the choice of the "concrete" division and "cast-in-place" section for that division. Each section as previously described is divided into three parts including (1) an introduction, (2) materials and use locations, and (3) an execution and installation information section.

The program automatically in blocks A56-A80 determines the status of those three parts for the particular section that the decision maker has chosen in block A54. In general, there are three status options any of the three parts of a section can have. A decision maker can either (1) add a part if that part has not been started previously, or he can (2) finish a part which has. Further, for any completed part he can always (3) revise that part, which may include deleting it completely. In blocks A56-A64 the program checks on the status of the introduction part to see if an introduction is present or if the introduction was exited by pressing the "hold" key. If the introduction is present as tested for in block A56, then the program determines whether the introduction was exited with the "hold" key in block A58. If such is not the case, then the choice that the decision maker should be given for this part is to "revise the introduction" and such message is displayed on the monochrome monitor 32 via block A64. If no introduction is present, then the message "add introduction" is displayed to the decision maker from block A60 on the monitor 32. Alternatively, if the introduction is present and it was exited by pressing the "hold" key, then a prompt to "finish the introduction" is displayed by block A62 on monitor 32.

Tests for the presence or the hold status for the materials and use locations part are accomplished in blocks A66 and A68. Block A72 if the materials and use locations part is not present, causes the display of a prompt on monitor to "add materials and use locations" in block A72. Otherwise a prompt to "revise the materials and use locations" is displayed via block A70 on the monitor 32. If a previously recorded materials and use locations part was exited with a hold, then the prompt to "finish the materials and use locations" is generated in block A74 on the monitor 32. In a similar manner, the presence and hold status for the execution and installation information is tested in block A76 and A78. Depending upon the answers to the tests, blocks A80, A82, and A84 display the messages to revise, add, or finish the execution and installation information, respectively.

Therefore, in block A86 status information for the three parts of a chosen section are displayed on the monochrome monitor 32. The decision maker is then prompted in block A88 to select one of the tasks depending upon its status. Page A5 of the Appendix illustrated a section which has a completed parts for Execution and Materials and use location, but does not yet have an introduction. None of the parts have been put on "hold" and the decision maker is selecting to revise the materials and use location.

Upon his choice of one of the three available part selections, a characteristic number is generated from 1-9 to notify the program of his choice. The selection process is the same as the menu selection process that the display pointer is moved to one of the three possible choices and the "yes" key is operated. This chooses one of the three parts with a status as determined by the previous blocks A56-A80 of the program, and further defines the characteristic number generated for a branch to a program module to handle that task.

Blocks A90-A106 decode the determination respectively. If the decision maker has chosen to operate on the introduction part, then, depending upon the status of the introduction part, one of modules A108-A112 is selected. If the decision maker has selected to operate on the materials and use locations, then, depending upon the status of that part, one of modules A114-A118 is called for execution. Similarly, if the decision maker has chosen to operate on the execution and installation information, then one of the modules A120-A124 is chosen corresponding to the status of that part.

When any of these functions are completed, the decision maker can return to the main menu by successive pressings of the "done" key. The "done" key moves the system up one level for every execution. For example, after the decision maker has added an introduction in block A108, pressing the "done" key will produce a transfer of control back to block A54 where he then has the option of either selecting another section or pressing the "done" key again to move to block A52. In block A52, the decision maker has the option of either selecting another division or pressing the "done" key to move to block A50. In block A50 a decision can be made to work on another project or to press the "done" key once more to return to the main menu.

If the system is to add any part, then the program will go to the selection process to first select the headings for the particular part being worked on as discussed with respect to FIGS. 7A, 7B, and 7C. This is the generalized selection process and is the same for any part of any section with only the data or option choices changed.

If the system is to finish any part, then the program will transfer control to the level and decision where the decision maker exited the selection process. This operation is a special function or subprogram of the add process and is identical to the operation described for FIGS. 7A, 7B, and 7C except the starting point is different. The operation allows a decision maker to exit the process at any time without losing all the work accomplished up to a particular decision.

Figure 11:
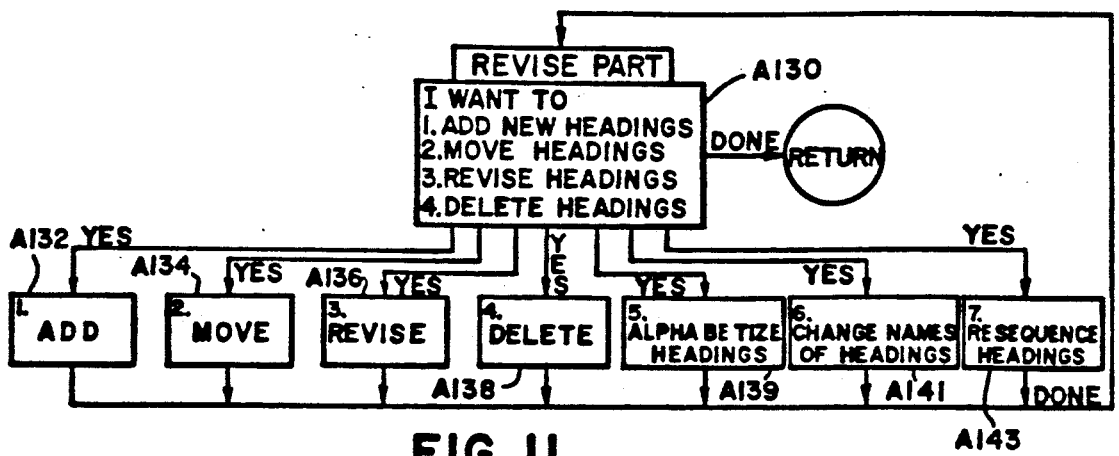
FIG. 11 is a detailed flow chart of the heading menu for the revise heading function of the program illustrated in FIG. 10.

Otherwise, if the system is to revise any part, then a menu of options for heading is shown. When at the revise heading level as shown in FIG. 11, the decision maker has a number of options from a menu A130 to determine with which function he will rise to operate on the headings data. The menu also shown as Page 6A of the Appendix includes seven choices which allows him to (1) add new headings by moving the display pointer to that position on the screen and pressing "yes". This operation calls the add headings module in block A132 which is exited by pressing the "done" to return to the menu 130. The choice to add headings transfers the system to the basic selection process and select heading level. The list of previously chosen headings and their openers and closers if completed, however, remain appended to the decision record. Similarly, there are included choices for (2) moving the headings, (3) revising the headings, (4) deleting the headings, (5) alphabetizing the heading, (6) changing the names, or (7) resequencing the headings. These menu choices cause the selection of modules A132, A134, A136, A138, A139, A141, and A143, respectively. The modules A132, A134, A136, A138, A139, A141, and A143 are exited by pressing the "done" key.

Figure 12:
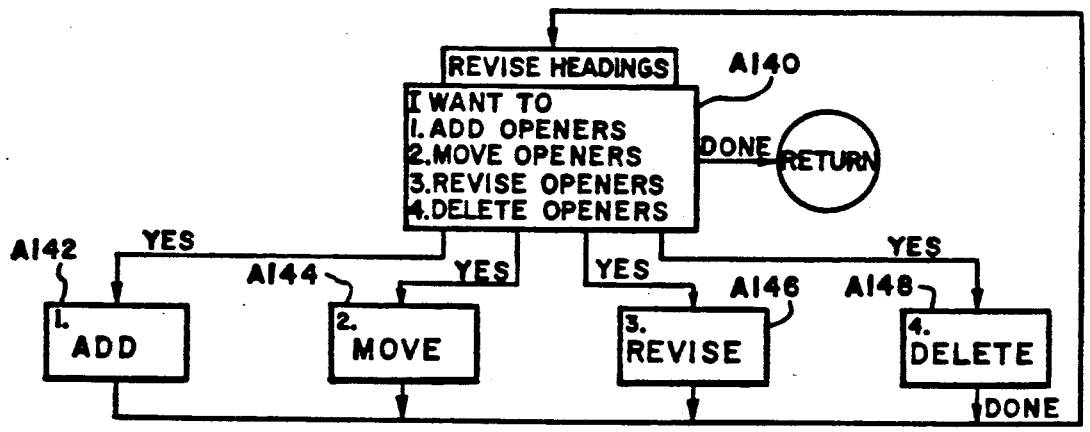
FIG. 12 is a detailed flow chart of the opener menu for the revise heading function illustrated in FIG. 11.

If the decision maker decides to revise the headings, then he chooses which ones to revise as shown at Page A7 of the Appendix. Once the revision choices are made, the list is placed in the auxiliary window and the opener option level is entered. The decision maker has options at the revise opener level as illustrated in FIG. 12. A menu A140 and Page A8 of the Appendix allows the decision maker to either (1) add openers, (2) move openers, (3) revise openers, or (4) delete openers. The selection is made by moving the display pointer to the selected option and then by pressing the "yes" key. The selection of one of the options transfers control from the menu portion of the program to either the add openers module 142, the move openers module 144, the revise openers module 146, or the delete openers module 148. The modules are exited by pressing the "done" key.

The addition of openers is the same process as that indicated before and retains the previous openers for the heading being worked on. After the new openers have been chosen, closers for the openers will be selected until the process is completed.

Figure 13:
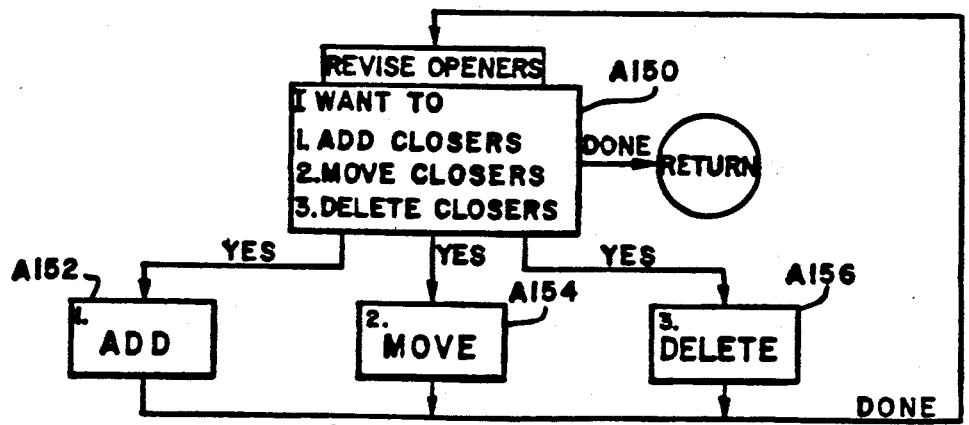
FIG. 13 is a detailed flow chart of the closer menu for the revise opener function illustrated in FIG. 12.

The choice of "revise" the opener's content transfers control of the program to a selection of the openers previously selected for a particular heading. This list for a heading of "Flexible water stop" is illustrated at Page A9 of the Appendix. After the openers have been selected, the program transfers control to a revise closer level. At the revise closers level, as illustrated in FIG. 13 and Page A10 of the Appendix, the decision maker has the option via menu A150 to either (1) add closers, (2) move closers, or (3) delete closers. The selection of an option is by the operation of the display pointer and the "yes" key. The program modules A152, A154, and A156 perform the necessary operation for the task selected. Exiting of each module is accomplished by the pressing of the "done" key. The add closers function is similar to the "add" function for the higher levels of the decision process.

While a preferred embodiment of the invention has been illustrated, it will be obvious to those skilled in the art that various modifications and changes may be made thereto without departing from the spirit and scope of the invention as defined in the appended claims.

A1

LOG-ON CHOICES

I AM:

→C.W. PHILLIPS
WILLIAM PHILLIPS
GERRY JACOBUS
FRED WALKER

A2

```
MAIN CHOICES                              |         |      |    |         | 9

I WANT TO:
┌─────────────────────────────────────────────────────────────────────────
→WORK ON PROJECT DOCUMENTS
 PRINT DOCUMENTS ON THE PRINTER
 START NEW PROJECT
 HA' E THE COMPUTER CHECK MY WORK
 DU .CATE PREVIOUS WORK
 REV  W PROJECT PROGRESS
 CHA' E MY PASSWORD
 REV  W THE FIRM'S PROGRESS
 CHAN   THE FIRM'S DESCRIPTION
```

A3

```
DIVISION CHOICES              |JPR TEST      |000001 |      |    | 16

I WANT TO:
 WORK ON PROJECT DOCUMENTS
 FOR PROJECT NUMBER:
   000001
 DIVISION:
┌─────────────────────────────────────────────────────────────────────────
  GE    GEORGE'S DIVISION
  00    BIDDING REQ'S, CONDITIONS OF THE CONTRACT, ETC.
  01    GENERAL REQUIREMENTS
  02    SITEWORK
 →03    CONCRETE
  04    MASONRY
  05    METALS
  06    WOOD AND PLASTICS
  07    THERMAL AND MOISTURE PROTECTION
  08    DOORS AND WINDOWS
  09    FINISHES
  10    SPECIALTIES
  11    EQUIPMENT
  12    FURNISHINGS
```

A4

```
SECTION CHOICES               |JPR TEST      |000001|03  |   | 10

I WANT TO:
 WORK ON PROJECT DOCUMENTS
 FOR PROJECT NUMBER:
   000001
 DIVISION:
   03  CONCRETE
 SECTION:
┌─────────────────────────────────────────────────────────────────────────
   03100    CONCRETE FORMWORK
   03200    CONCRETE REINFORCEMENT
   03250    CONCRETE ACCESSORIES
  →03300    CAST-IN-PLACE CONCRETE
   03370    CONCRETE CURING
   03400    PRECAST CONCRETE
   03500    CEMENTITIOUS DECKS
   03600    GROUT
   03700    CONCRETE RESTORATION AND CLEANING
   03800    MASS CONCRETE
```

A5

```
PART LEVEL CHOICES              |JPR TEST        |000001|03300|           | 3
```

ADD INTRODUCTION
→REVISE MATERIALS AND USE LOCATION
REVISE EXECUTION

A6

```
HEADING LEVEL CHOICES           |JPR TEST        |000001|03300|REVISE MA| 7
```

ADD HEADINGS
MOVE HEADINGS
→REVISE HEADINGS' CONTENT
DELETE HEADINGS
ALPHABETIZE HEADINGS
CHANGE HEADINGS' NAME
RESEQUENCE HEADINGS

A7

```
REVISE HEADING CHOICES          |JPR TEST        |000001|03300|REVISE MA| 1
```

I WILL REVISE THE CONTENTS OF THESE HEADINGS:

→FLEXIBLE WATERSTOPS

A8

```
OPENER LEVEL OPTIONS            |JPR TEST        |000001|03300|REVISE MA| 4
                                                                         |FLEXIBLE WA
```

ADD NEW OPENERS
MOVE OPENERS
→REVISE OPENER'S CONTENT
DELETE OPENERS

A9

```
REVISE OPENER CHOICES            |JPR TEST       |000001|03300|REVISE MA| 11
                                                                        |FLEXIBLE WA

I WILL REVISE THE CONTENTS OF THESE OPENERS:

→REFERENCED INDUSTRY STANDARDS AND STANDARD SPECIFICATIONS:
 MANUFACTURER/PRODUCT:
 TYPE:
 MATERIAL:
 SIZE:
 HEAD OF WATER FOR WHICH WATERSTOP IS DESIGNED:
 TENSILE STRENGTH OF FINISHED WATERSTOP:
 ULTIMATE ELONGATION OF FINISHED WATERSTOP:
 ALKALI EFFECT:
 TEAR RESISTANCE:
 USE THIS FLEXIBLE WATERSTOP TYPE AT THESE LOCATIONS:
```

A10

```
REVISE OPTIONS                   |JPR TEST       |000001|03300|REVISE MA| 3
                                                                        |FLEXIBLE WA

→INSERT CLOSERS IN MY CLOSERS
 MOVE CLOSERS WITHIN MY CLOSERS
 :DELETE CLOSERS FROM MY CLOSERS
                                                                        |REFERENCED
                                                                        |TYPE
                                                                        |HEAD OF WAT
```

What is claimed is:

1. An apparatus for automating a decision making process for a decision maker and for recording decisions made from that process by formulating a decision record, said apparatus comprising:

a processor system including storage means which store a control program, said processor system being adapted to execute said control program and generate control signals as a result of the execution;

an expert data base comprising a plurality of entries of information units arranged in option levels describing the various choices available for the decision maker in a particular subject area until a decision is reached, said option level ranging from a broad description of the category of a choice at the highest level, through various intermediate options levels and finishing with a complete specification of a decision at the lowest level;

a display means for displaying said information units of the expert data base according to said option levels;

said storage means of said processor system including a volatile memory means, and a nonvolatile memory means for storing said expert data base;

said processor system loading a portion of said expert data base into said volatile memory means in response to the selection of one of said option levels;

an input means for communicating commands, including a selection process with selection commands which indicate the selection of one information unit to said processor system for the decision maker;

said selected information units being displayed on said display means concurrently with the selection process;

optical storage means for storing said expert data base including a plurality of video frames of data and associated sound segments, each of said video frames corresponding to at least one of said information units; and optical storage reader means, under control of said processor, adapted to transfer data stored on said optical storage means into said volatile memory means, wherein said processor system for response to each of said selection commands formulates said decision record.

2. An apparatus for automating a decision making process as defined in claim 1 wherein said display means further includes:

means for displaying said video frames.

3. An apparatus for automating a decision making process as defined in claim 2 which further comprises:

means for generating an access record indicating which particular video frames have been displayed on said display means during the formation of said decision record; and means for appending said access record on to said decision record.

4. An apparatus for automating a decision making process as defined in claim 3 wherein:

said access record generating means further stores the time when the display of a video frame started and when it ended.

5. An apparatus for automating a decision making process as defined in claim 2 wherein:

sequential groups of said video frames can used to provide moving images on said display.

6. An apparatus for automating a decision making process as defined in claim 1 wherein:

said identification of said selected one information unit is a pointer to the location of said information unit in said expert data base.

7. An apparatus for automating a decision making process as defined in claim 6 wherein:

said pointer is a record number indicating the byte offset of said information unit from the start of the data base.

8. An apparatus for automating a decision making process as defined in claim 1 wherein said display means further includes:

means for displaying said video frames and playing said associated sound segments.

9. An apparatus for automating a decision making process as defined in claim 1 wherein:

said expert data base includes combinations of information units making a complete and logical description of a higher level information unit;

an identifier of said combination of information units is displayed as a separate selection on said display means; and said processor system in response to the selection of said identifier of said combination of information units transfers indicators of said combination to said decision record.

10. An apparatus for automating a decision making process for a decision maker and for recording decisions made from that process by formulating a decision record, said apparatus comprising:

a processor system including storage means which store a control program, said processor system being adapted to execute said control program and generate control signals as a result of the execution;

said storage means of said processor system including an expert data base comprising a plurality of entries of information units arranged in option levels describing the various choices available for the decision maker in a particular subject area until a decision is reached, said option levels ranging from a broad description of the category of a choice at the highest level, through various intermediate options levels and finishing with a complete specification of a decision at the lowest level;

a display means for displaying said information units of the expert data base according to said option levels;

a volatile memory means, and a nonvolatile memory means for storing said expert data base;

said processor system loading a portion of said expert data base into said volatile memory means in response to the selection of one of said option levels;

an input means for communicating commands, including a selection process with selection commands which indicate the selection of one information unit to said processor system for the decision maker;

said selected information units being displayed on said display means concurrently with the selection process;

optical storage means for storing said expert data base including a plurality of video frames of data and associated sound segments, each of said video frames corresponding to at least one of said information units; and wherein said processor system in response to each of said selection commands formulates said decision record.

* * * * *